United States Patent
Tanida et al.

(10) Patent No.: US 6,285,602 B1
(45) Date of Patent: *Sep. 4, 2001

(54) SEMICONDUCTOR MEMORY DEVICE PROVIDED WITH I/O CLAMP CIRCUIT

(75) Inventors: Susumu Tanida; Yasuhiko Tsukikawa, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,878

(22) Filed: Jul. 16, 1998

(30) Foreign Application Priority Data

Jan. 5, 1998 (JP) .................................... 10-000109

(51) Int. Cl.$^7$ ...................................... G11C 16/04
(52) U.S. Cl. ................ 365/189.06; 365/189.06; 365/189.11; 365/189.01
(58) Field of Search .................. 365/189.06, 189.11, 365/189.01

(56) References Cited

U.S. PATENT DOCUMENTS

| | | | |
|---|---|---|---|
| 5,239,508 | * | 8/1993 | Nomura et al. ............... 365/189.06 |
| 5,260,904 | * | 11/1993 | Miyawaki et al. ........... 365/189.06 |
| 5,369,613 | * | 11/1994 | Matsui ........................... 365/189.06 |
| 5,508,966 | * | 4/1996 | Nakase .............................. 365/208 |
| 5,642,314 | * | 6/1997 | Yamauchi .................... 365/189.06 |

FOREIGN PATENT DOCUMENTS

| | | |
|---|---|---|
| 2-103797 | 4/1990 | (JP) . |
| 3-154291 | 7/1991 | (JP) . |
| 4-115622 | 4/1992 | (JP) . |
| 4-349297 | 12/1992 | (JP) . |
| 6-068680 | 3/1994 | (JP) . |
| 9-171697 | 6/1997 | (JP) . |

* cited by examiner

Primary Examiner—David Nelms
Assistant Examiner—Connie C. Yoha
(74) Attorney, Agent, or Firm—McDermott, Will & Emery (57) ABSTRACT

A potential of an I/O line pair is defined at $Vcc2-Vth$ by a clamp circuit, and a clamp voltage is generated by a current mirror circuit including an n channel MOS transistor and p channel MOS transistors and a constant current source. The I/O line pair is thus clamped through p channel MOS transistors connected in series between the I/O line pair.

9 Claims, 7 Drawing Sheets

FIG.9A PRIOR ART STAND-BY

FIG.9B PRIOR ART READ

FIG.9C PRIOR ART Vcc

FIG.9D PRIOR ART I/O LINE PAIR

SEMICONDUCTOR MEMORY DEVICE PROVIDED WITH I/O CLAMP CIRCUIT

BACKGROUND OF THE INVENTION

1. Field of the Invention

The present invention relates to a semiconductor memory device provided with an I/O clamp circuit. More specifically, the present invention relates to a semiconductor memory device including an I/O clamp circuit for clamping a pulled up or pulled down node of an I/O line pair for applying an output signal of a sense amplifier included in a DRAM to a preamplifier.

2. Description of the Background Art

Figure 8:
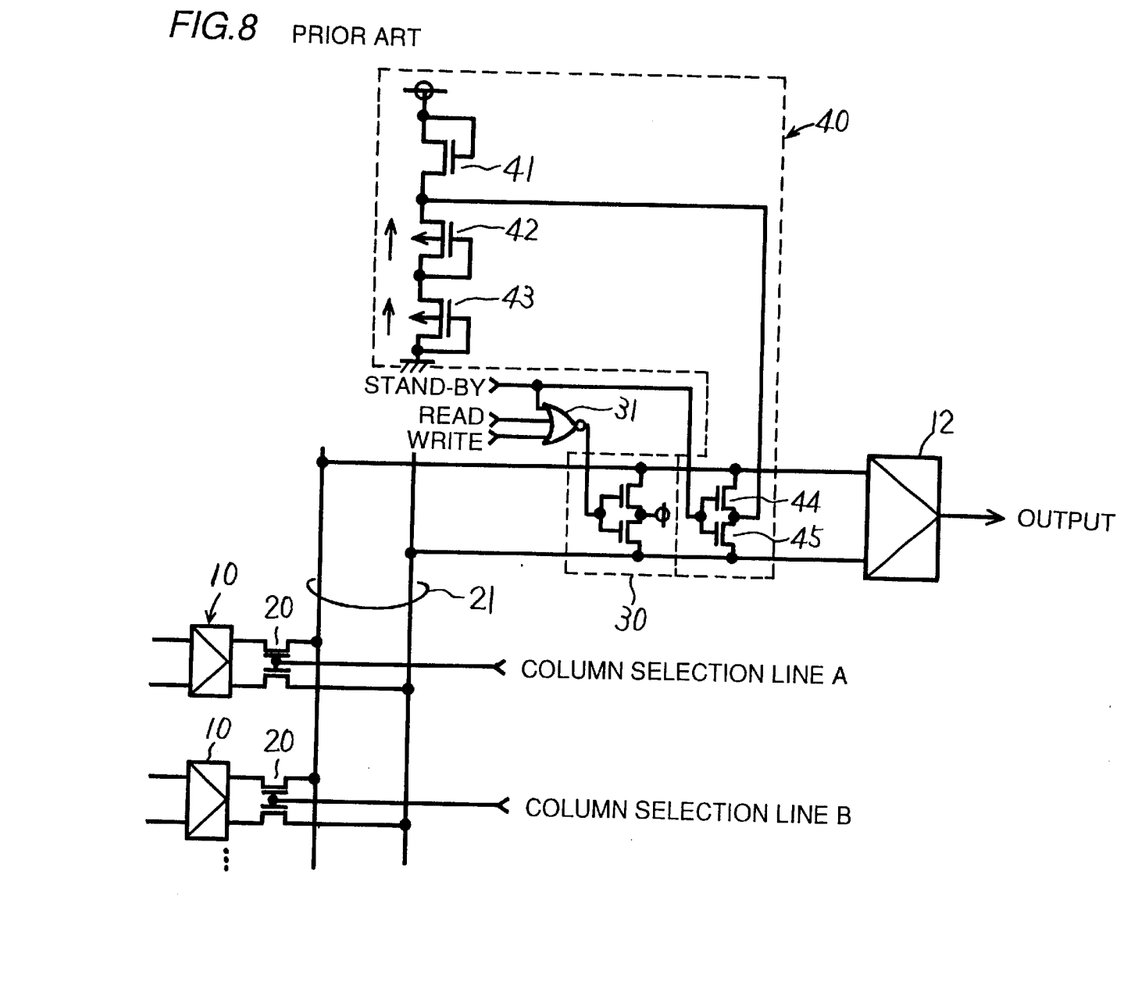
FIG. 8 is a circuit diagram showing an I/O line pair clamp circuit in a conventional DRAM.

FIG. 8 is a schematic circuit diagram of an I/O line clamp circuit in a conventional DRAM. Referring to FIG. 8, a plurality of sense amplifiers 10 are connected through a plurality of transfer gates 20 to one end of an I/O line pair. Transfer gate 20 is turned on and off in response to a column selection line signal. The other end of I/O line pair 21 is connected to an input of a preamplifier 12. Preamplifier 12 amplifies a signal connected to I/O line pair 21, as I/O line pair 21 is relatively long and hence has a large capacitance and sense amplifier 10 has small drivability. Preamplifier 12 is an analog circuit and therefore it is necessary to appropriately set an input bias. Therefore, a pull up circuit 30 is connected between I/O line pair 21. Pull up circuit 30 is generally formed by a series connection of two MOS transistors. When a read signal, a write signal or a standby signal at a logical high ("H") level is input to NOR gate 31, pull up circuit 30 is turned off by an output from NOR gate 31.

Further, a clamp circuit 40 is connected to I/O line pair 21 so that charges are not left on I/O line pair 21 due to negative bump of a power supply voltage in the standby state. Clamp circuit 40 includes a clamp signal generating circuit including an n channel MOS transistor 41 having relatively long channel length L and very small supplying capability and p channel MOS transistors 42 and 43 having relatively large supplying capability connected in series between a power supply and a ground, and two n channel MOS transistors 44 and 45 connected in series between the pair of I/O lines 21. In the clamp generating circuit, two n channel MOS transistors are connected in series. However, the number of stages may be changed in accordance with the clamp voltage.

FIGS. 9A to 9D are time charts related to the operation of the I/O clamp circuit shown in FIG. 8. The operation of the I/O clamp circuit shown in FIG. 8 will be described with reference to FIGS. 9A to 9D.

Figures 9A, 9B:
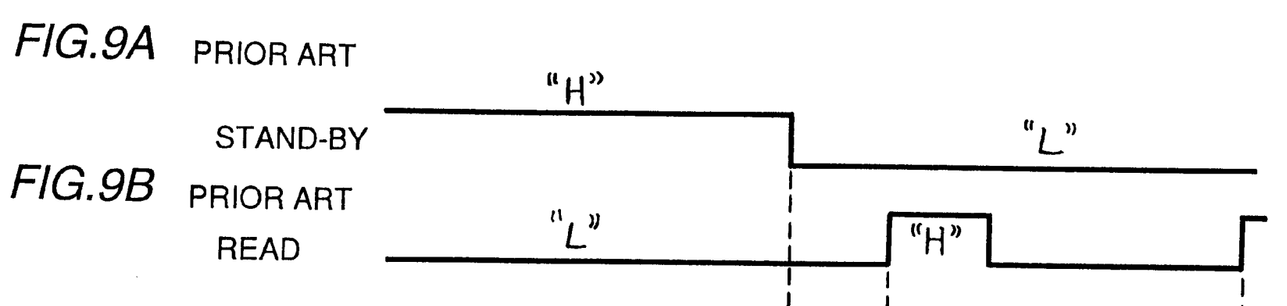
FIGS. 9A to 9D are timing charts related to the operation of the I/O clamp circuit shown in FIG. 8.
Figure 9C:
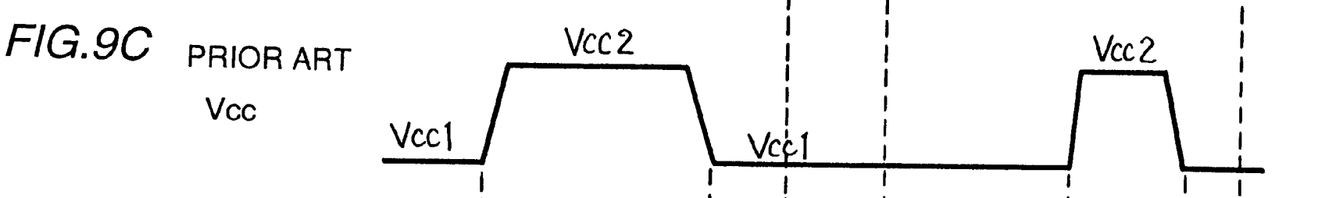
Figure 9D:
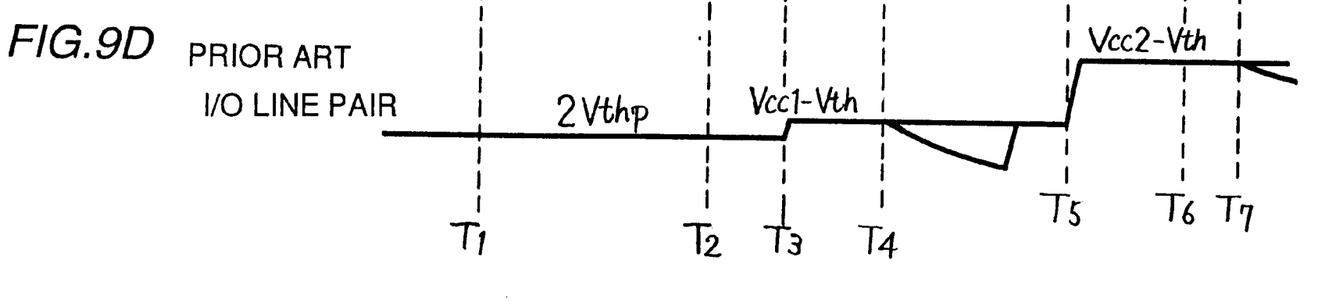

Referring to FIG. 9A, while the standby signal is at the "H" level, that is, in the standby state, potential of I/O line pair 21 is kept at 2 Vthp as shown in FIG. 9D by the function of clamp circuit 40, provided that power supply voltage changes from Vcc1 to Vcc2 at time T1 and it changes from Vcc2 to Vcc1 at time T2.

Assuming that standby signal is switched from "H" to "L" level at time T3 and is activated, n channel MOS transistors 44 and 45 are turned off, the output from NOR gate 31 attains to the "HI" level and pull up circuit 30 operates. Accordingly, the potential of I/O line pair 21 attains to Vcc1–Vth.

When read signal represented by FIG. 9B attains to "H" level at time T4, pull up circuit 30 is turned off, a column selection line is selected and data of the selected sense amplifier 10 appears on I/O line pair 21 through transfer gate 20. Input bias of preamplifier 12 is at an appropriate value (Vcc1–Vth).

An operation when power supply voltage Vcc fluctuates in the active state will be described. Assuming that power supply voltage Vcc changes from Vcc1 to Vcc2 at time T5, the potential of I/O line pair 21 rises to Vcc2–Vth by the function of pull up circuit 30. When power supply voltage Vcc returns from Vcc2 to Vcc1 at time T6, I/O line pair 21 is kept at the potential of Vcc2–Vth as shown in FIG. 9D, as the pull up circuit 30 has single directivity, that is, it operates only in the direction of increasing the potential of I/O line pair 21 and clamp circuit 40 is not in operation. When a reading operation is performed at time T7, I/O line pair 21 is opened, referring to the potential Vcc2–Vth. Here, optimal input bias for preamplifier 12 is Vcc1–Vth, and therefore operation margin of preamplifier 12 will not be ensured.

Therefore, though the conventional clamp circuit is effective against fluctuation of Vcc in the standby state, it is not effective against fluctuation of Vcc in the active state.

SUMMARY OF THE INVENTION

Therefore, an object of the present invention is to provide a semiconductor memory device including an I/O clamp circuit capable of clamping a potential of an I/O line pair even in the active state.

Briefly stated, the present invention provides a semiconductor device including an I/O clamp circuit connected to an I/O line pair for applying an output signal from a sense amplifier to a preamplifier, in which a current mirror circuit is provided for clamping the potential of the I/O line pair at a prescribed potential in the active state.

Therefore, according to the present invention, even in the active state, the potential of the I/O line pair can be clamped by the I/O clamp circuit.

More preferably, the I/O clamp circuit includes a first transistor of a first conductivity type having a first electrode and an input electrode connected to a first reference potential and a current mirror circuit including second and third transistors of a second conductivity type connected to the first reference potential through the first transistor, for generating a clamp potential signal, and a clamp circuit including fourth and fifth transistors of the second conductivity type connected in series between a pair of I/O lines for clamping the I/O line pair in response to the clamp potential signal applied from the current mirror circuit.

More preferably, in the current mirror circuit, the second transistor has a first electrode connected to a second electrode of the first transistor and an input electrode and a second electrode connected to an input electrode of the third transistor, the third transistor has a first electrode connected to a node between the fourth and fifth transistors and a second electrode connected to the reference potential, and further, a constant current source is connected between the second electrode of the second transistor and a second reference potential.

A resistance may be connected in place of the constant current source.

Further, a sixth transistor for pulling up is diode connected between the first electrode of the third transistor and the first reference potential. Further, a coupling capacitor is connected between the first reference potential and the input electrodes of the second and third transistors. The voltage fluctuation of the clamp circuit can be better followed as the coupling capacitor is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
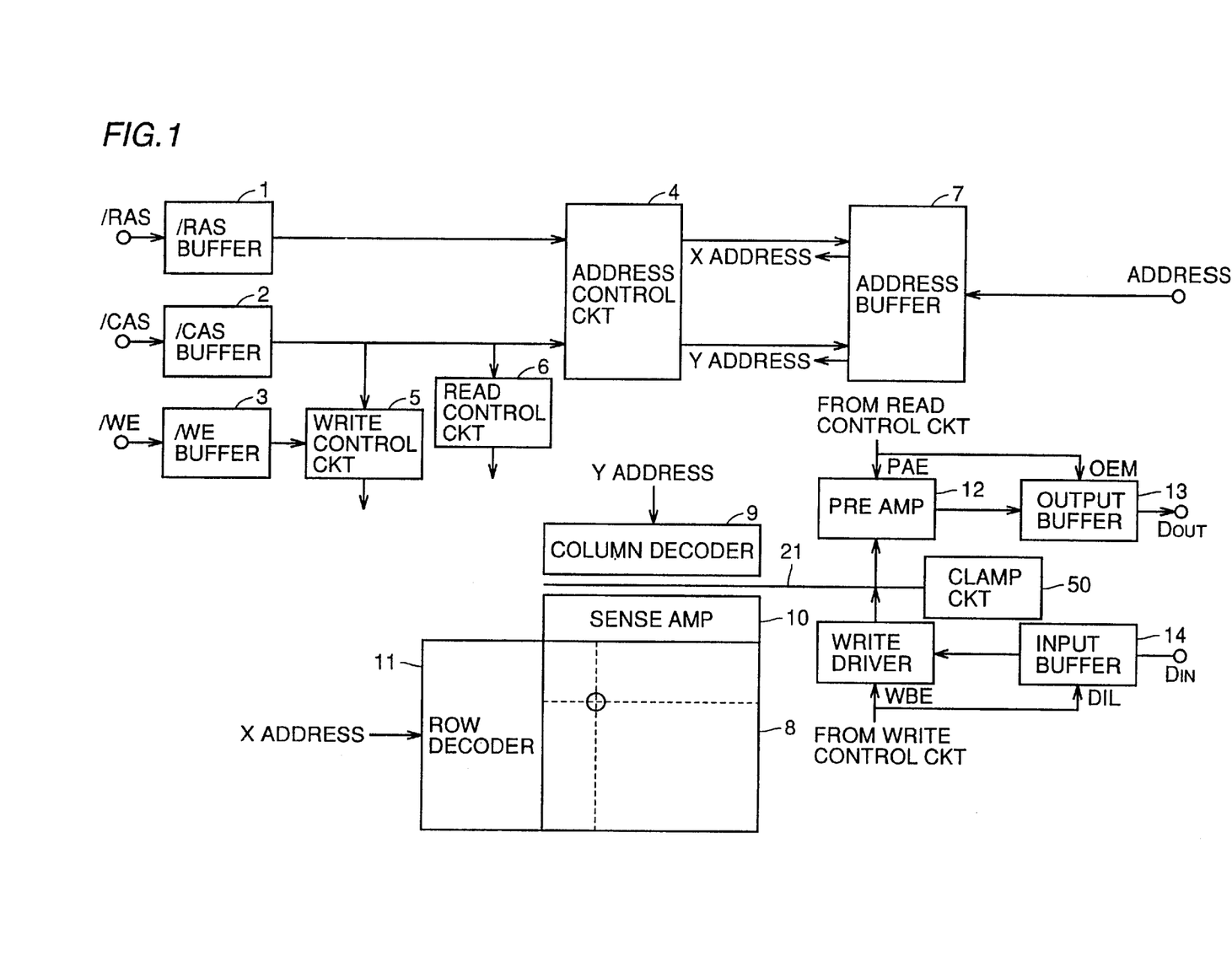
FIG. 1 is a block diagram showing an overall structure of a DRAM to which one embodiment of the present invention is applied.

FIG. 1 is a schematic block diagram showing an overall structure of the DRAM to which one embodiment of the present invention is applied.

Referring to FIG. 1, an externally input row address strobe signal /RAS is input to a /RAS buffer 1 from which an internal /RAS signal is generated and applied to an address control circuit 4. Address control circuit 4 takes in an externally input row address signal based on internal /RAS into address buffer 7, an X address signal is applied from address buffer 7 to a row decoder 11, and an X address of a memory cell 8 is designated.

After the row address strobe signal /RAS is taken in, a column address strobe signal ICAS is taken into a /CAS buffer 2 and converted to an internal /CAS signal. The internal /CAS signal is applied to address control circuit 4, a write control circuit 5 and a read control circuit 6. Address control circuit 4 takes in an externally input column address signal to address buffer 7, in response to internal /CAS signal. Address buffer 7 applies a Y address signal to column decoder 9 based on the column address signal, and column decoder 9 designates a Y address of memory cell 8.

A write enable signal /WE for distinguishing reading and writing is taken into a /WE buffer 3, and an internal /WE signal is generated. When the /WE signal attains to the "L" level, write control circuit 5 is activated, and data input to an input buffer 14 is written to memory cell 8 through a write driver 15. At the time of reading, write enable signal /WE attains to the "H" level, read control circuit 6 activates preamplifier 12 and an output buffer 13, data is read from memory cell 8, and is output through sense amplifier 10, preamplifier 12 and output buffer 13. An I/O clamp circuit 50 is connected to I/O line pair 21 connecting sense amplifier 10 and preamplifier 12.

Figure 2:
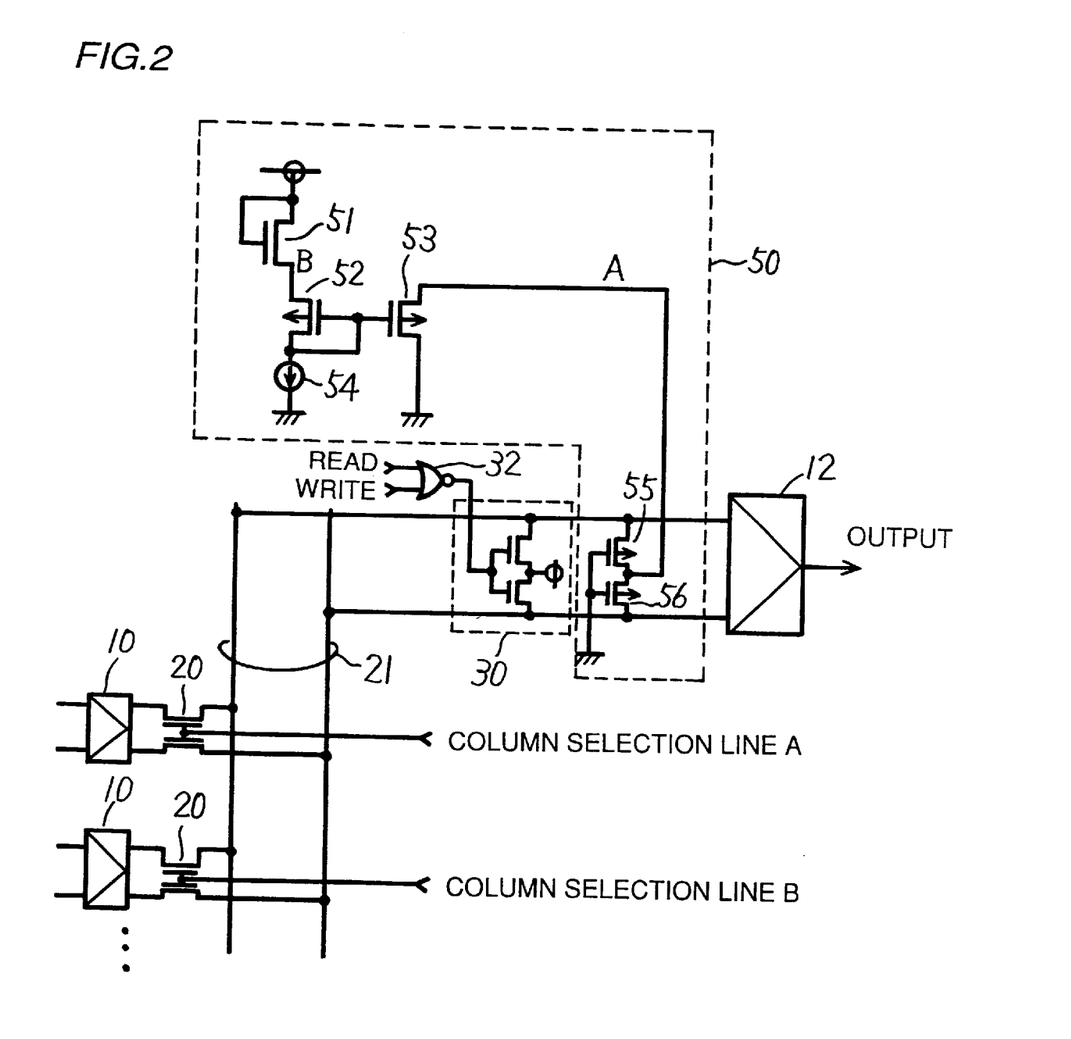
FIG. 2 is a circuit diagram showing an I/O clamp circuit in accordance with one embodiment of the present invention.

FIG. 2 is a circuit diagram showing the I/O clamp circuit in accordance with one embodiment of the present invention. In this embodiment, I/O clamp circuit 50 shown in FIG. 2 is connected to I/O bit line pair 21 in place of I/O clamp circuit 40 shown in FIG. 8. A pull up circuit 30 is connected to I/O line pair 21. Since pull up circuit 30 is a single direction element, it is capable of charging I/O line pair 21. However, it is not capable of discharging. Therefore, clamp circuit 50 is connected to I/O line pair 21 for keeping potential of I/O line pair 21 at an acceptable value, when the potential of I/O line pair 21 is excessively increased by some cause.

I/O clamp circuit 50 includes an n channel MOS transistor 51, p channel MOS transistors 52 and 53, and a constant current source 54, and it is connected to I/O line pair 21 through p channel MOS transistors 55 and 56. The n channel MOS transistor 51 is set to have a relatively large size and has sufficient current supplying capability with respect to the current provided by constant current source 54. The n channel MOS transistor 51 has its drain and gate connected to a power supply line.

The p channel MOS transistors 52 and 53 constitute a current mirror circuit, and p channel MOS transistor 52 has its source connected to the source of n channel MOS transistor 51, and its drain and gate connected to the gate of p channel MOS transistor 53 as well as to constant current source 54. The p channel MOS transistor 53 has its drain grounded, and its source connected to the drain of p channel MOS transistor 55 and the source of p channel MOS transistor 56. The p channel MOS transistor 55 has its source connected to one of the pair of I/O lines 21, and p channel MOS transistor 56 has its drain connected to the other one of the pair of I/O lines 21.

Figure 3:
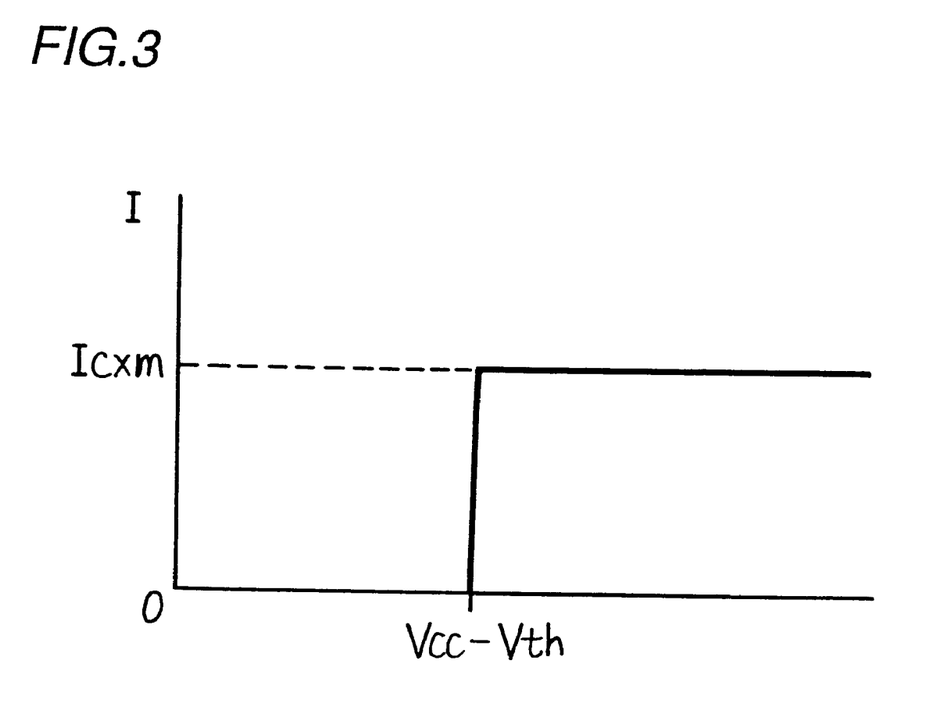
FIG. 3 is an illustration showing discharge capability of a node A shown in FIG. 2.

FIG. 3 illustrates discharging capability of node A shown in FIG. 2, and FIGS. 4A to 4C are timing charts related to the operation of one embodiment of the present invention.

The operation of the I/O clamp circuit shown in FIG. 2 will be described with reference to FIGS. 3 and 4A to 4C. Since n channel MOS transistor 51 is set to have a relatively large size, it has sufficient current supplying capability with respect to the current provided by the constant current source 54, and hence node A attains to Vcc−Vth. The potential is mirrored by the current mirror circuit constituted by p channel MOS transistors 52 and 53, and discharging characteristic of p channel MOS transistor is thus determined.

When we represent mirror ratio by m and the current of constant current source 54 by Ic, the discharge characteristic is as shown in FIG. 3. The direction of the current flowing to the ground side of p channel MOS transistor 53 is considered positive. As can be seen from FIG 3, the discharge characteristic of node A is such that discharge hardly occurs when the potential of node A is lower than Vcc−Vth, and discharge occurs when the potential is higher than this value.

Figures 4A, 4B:
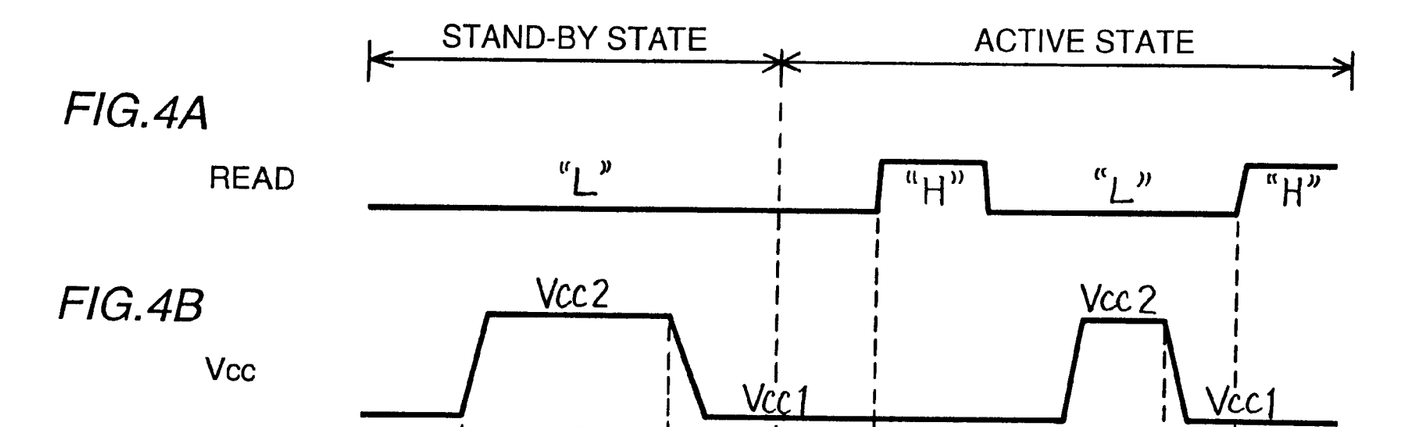
FIGS. 4A to 4C are timing charts related to the operation of one embodiment of the present invention.
Figure 4C:
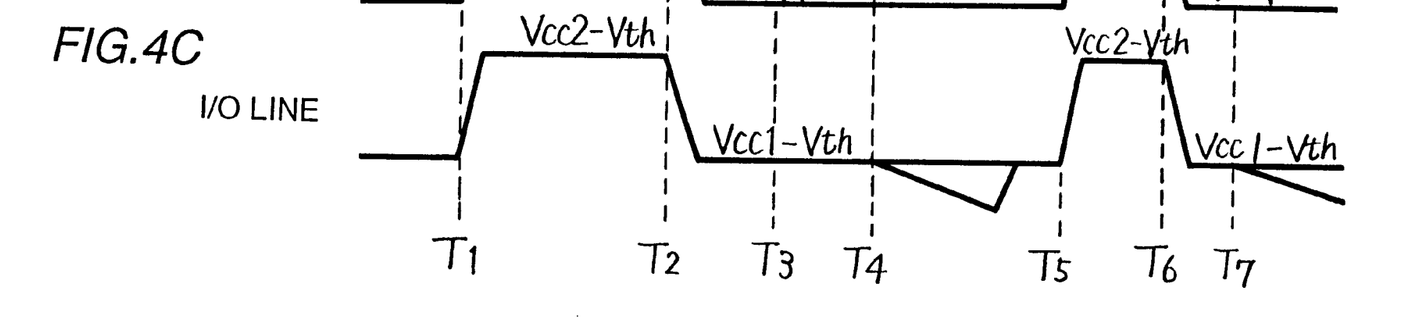

The overall operation will be described with reference to FIGS. 4A to 4C. Assume that the power supply voltage Vcc makes a transition from Vcc1 to Vcc2 in the standby state, for example, at time T1, as shown in FIG. 4B, then the potential of I/O line pair 21 is pulled up to Vcc2−Vth by pull up circuit 30, as shown in FIG. 4C. At this time, clamp circuit 30 operates with the potential of I/O line pair 21 being not lower than Vcc2−Vth, and hence the potential of I/O line pair 21 is kept at Vcc2−Vth.

Thereafter, when power supply voltage Vcc changes from Vcc2 to Vcc1 at time T2, the potential of I/O line pair 21 is settled at Vcc1−Vth by the function of clamp circuit 30, which is operating with the potential of I/O line pair 21 being not lower than Vcc1−Vth. Further, even in the active state, the potential of I/O line pair 21 assumes an appropriate value, following the change in the power supply voltage Vcc in the similar manner. Therefore, in reading operation with the power supply voltage Vcc fluctuating, for example, in the reading operation at time T7, the I/O line pair is opened referring to Vcc−Vth, and hence the input bias for the preamplifier 12 is always kept at an acceptable value. Therefore, a clamp circuit 50 which operates not only in the standby state but also in the active state is realized.

A resistance may be used in place of constant current source 54 shown in FIG. 2. A diffusion resistance, a pull resistance, a transistor resistance may be used.

Figure 5:
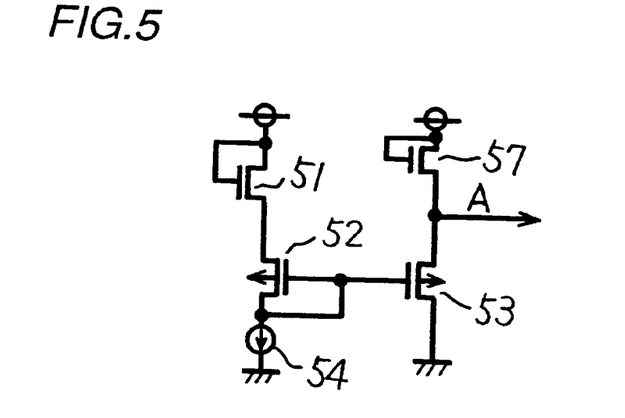
FIG. 5 is a circuit diagram showing a clamp voltage generating circuit in accordance with another embodiment of the present invention.

FIG. 5 is a circuit diagram showing a clamp voltage generating circuit in accordance with another embodiment of the present invention. Referring to FIG. 5, an n channel MOS transistor 57 is connected in series between the source of p channel MOS transistor 53 of the clamp voltage generating circuit shown in FIG. 2 and a power supply. Provision of n channel MOS transistor 57 contributes to faster stabilization of node A at the time of power on.

Figure 6:
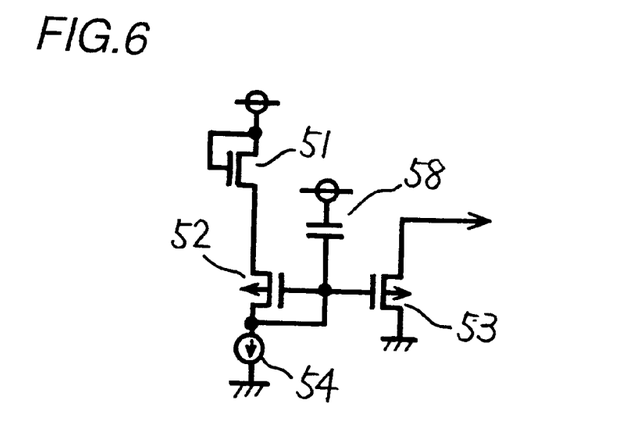
FIG. 6 is a circuit diagram showing a clamp voltage generating circuit in accordance with a still another embodiment of the present invention.

FIG. 6 is a circuit diagram showing a clamp voltage generating circuit in accordance with a still another embodiment. In the example shown in FIG. 6, a coupling capacitor 58 is connected between a power supply terminal and gates of p channel MOS transistors 52 and 53 of the clamp voltage generating circuit shown in FIG. 2. Fluctuation of the power supply voltage Vcc is better followed by the provision of coupling capacitor 58.

Figure 7:
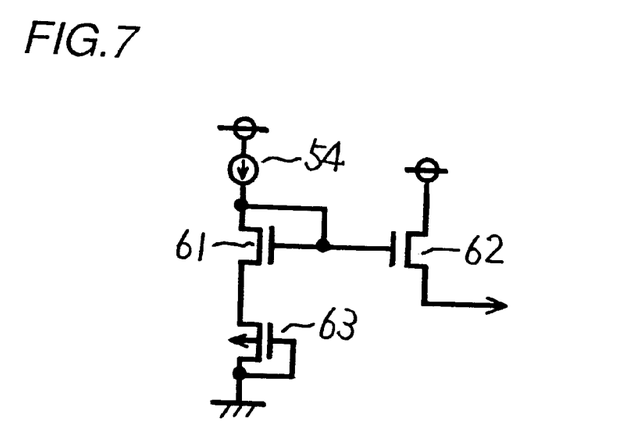
FIG. 7 is a circuit diagram showing a clamp voltage generating circuit in accordance with a still further embodiment of the present invention.

FIG. 7 is a circuit diagram showing a clamp voltage generating circuit in accordance with a still further embodiment. In this example, constant current source 54 is provided on the side of power supply terminal, the current mirror circuit is constituted by n channel MOS transistors 61 and 62, and the current mirror circuit is grounded through a p channel MOS transistor 63.

Further, by providing one clamp circuit 50 shown in FIG. 2 for a plurality of I/O line pairs, power consumption can be reduced than when the clamp circuit is provided for each pair.

As described above, according to the embodiments of the present invention, an I/O clamp circuit including a current mirror circuit for clamping the potential of the I/O line pair at a prescribed potential in the active period is provided, and therefore the potential of the I/O line pair can be clamped even in the active state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device provided with an I/O clamp circuit connected to an I/O line pair for applying an output signal from a sense amplifier to a preamplifier, comprising a current mirror circuit for clamping a potential of said I/O line pair at a prescribed potential in an active state.

2. The semiconductor memory device provided with an I/O clamp circuit according to claim 1, wherein said I/O clamp circuit includes a first transistor of a first conductivity type having a first electrode and an input electrode connected to a first reference potential, a current mirror circuit including second and third transistors of a second conductivity type connected to said first reference potential through said first transistor, for generating a clamp potential signal, and a clamping circuit including fourth and fifth transistors connected in series between said I/O line pair for clamping said I/O line pair in response to the clamp potential signal applied from said current mirror signal.

3. The semiconductor memory device provided with an I/O clamp circuit according to claim 2, wherein in said current mirror circuit, said second transistor has a first electrode connected to a second electrode of said first transistor, and an input electrode and a second electrode connected to an input electrode of said third transistor, said third transistor has a first electrode connected to a node between said fourth and fifth transistors, and a second electrode connected to the reference potential, and a constant current source is provided connected between the second electrode of said second transistor and a second reference potential.

4. The semiconductor memory device provided with an I/O clamp circuit according to claim 3, wherein a resistance is connected in place of said constant current source.

5. The semiconductor memory device provided with an I/O clamp circuit according to claim 3, further comprising a sixth transistor for clamping, diode connected between the first electrode of said third transistor and said first reference potential.

6. The semiconductor memory device provided with an I/O clamp circuit according to claim 3, further comprising a coupling capacitor connected between said first reference potential and the input electrodes of said second and third transistors, for improving voltage fluctuation following characteristic of said clamp circuit.

7. The semiconductor memory device provided with an I/O clamp circuit according to claim 1, wherein said I/O clamp circuit is provided for a plurality of I/O line pairs.

8. A semiconductor device provided with an I/O line connecting a first sense amplifier and a second sense amplifier, and connected to a first reference potential and a second reference potential lower than said first reference potential, wherein a connecting element and a transistor are connected in series between said I/O line and said second reference potential;

said transistor has a first electrode connected to said connecting element, a second electrode connected to said second reference potential, and a control electrode connected to a circuit supplying a constant potential to said control electrode; and when potential of said I/O line exceeds a prescribed potential between said first and second potentials, a current flows from said I/O line through said connecting element and said transistor to said second potential.

9. A semiconductor device provided with an I/O line connecting a first sense amplifier and a second sense amplifier, and connected to a first reference potential and a second reference potential lower than said first reference potential, comprising a circuit causing a current flow from said I/O line to said second reference potential when potential of said I/O line rises from a prescribed potential between said first and second potentials while said semiconductor device is active.

* * * * *